May 2, 1967 E. H. LAYER, JR., ETAL 3,317,653

ELECTRICAL COMPONENT AND METHOD OF MAKING THE SAME

Filed May 7, 1965

INVENTORS
EDWIN H. LAYER JR.
DARWYN L. HERBST
BY John J. Gaydos
ATTORNEY

United States Patent Office 3,317,653
Patented May 2, 1967

3,317,653
ELECTRICAL COMPONENT AND METHOD OF MAKING THE SAME

Edwin H. Layer, Jr., Elkhart, and Darwyn L. Herbst, Lafayette, Ind., assignors to CTS Corporation, Elkhart, Ind., a corporation of Indiana Filed May 7, 1965, Ser. No. 453,994
7 Claims. (Cl. 174—68.5)

The present invention relates to an electrical component, and, more particularly, to a planar lead crossover and to a method of making the same.

The advent of thin film circuitry has made it possible to support a plurality of electrical devices of a complete operable circuit, e.g., a flip-flop circuit, on a thin substrate having a surface area of approximately one fourth square inch. Complex patterns are laid out to provide proper spacing between the electrical devices and the conductive paths connecting the electrical devices together for maintaining maximum component density. In some circuits employing complex patterns, it has been possible to transpose some of the electrical devices and avoid a crossover. Other more complex circuits, such as certain flip-flop circuits, generally cannot be supported on a single surface of the substrate unless one of the conductive paths or leads crosses over another conductive lead. Ingenious approaches for solving the problem have been employed, the most common solution being effected by depositing a conductive path between a pair of spaced conductive pads on the same surface of the substrate containing the electrical devices and securing an external conductor, i.e., a jumper lead, to the pair of conductive pads in a suitable manner such as by soldering or welding. When it is desirable to avoid a jumper lead, a pair of conductive leads connected to the conductive pads pass through a pair of openings provided in the substrate and connect the ends of the conductive pads to a conductive lead deposited on the other side of the substrate. These approaches currently employed in the industry are satisfactory although flexibility of layout is limited and available space is not used most efficiently. Moreover a non-thin film interconnection such as a jumper lead can decrease reliability of the electrical circuit. It would, therefore, be desirable to provide an improved lead crossover enabling a circuit designer to lay out a circuit rapidly and efficiently with greater flexibility of circuit design.

In order that the terminology used in the specification will be fully understood, certain terms are being defined below:

Electrical Device—includes both active and/or passive devices.

Active Device—denotes an electrical circuit component, e.g., a diode or a transistor, capable of performing amplifying or control functions.

Passive Device—denotes an electrical circuit component not capable of performing amplifying or control functions, e.g., a resistance element, a capacitor or a crossover.

Circuit Module—denotes an electrical component or packaged circuit containing a plurality of electrical devices of a size that at least 200,000 electrical devices supported by a plurality of circuit modules can be packaged in one cubic foot.

Planar Crossover—denotes an electrical component lying in a single plane for interconnecting electrical devices supported on the substrate.

When depositing passive devices such as thin film capacitors or resistance elements onto a surface of a substrate to form a circuit module requiring a planar crossover, it is preferable to employ a crossover which can be deposited in the same manner or in a manner compatible with the existing processes, i.e., the manufacturing processes of depositing, e.g., by screening, and then firing the planar crossover should not alter the characteristics of the passive devices. Otherwise, the planar crossover must be applied to the substrate before the passive devices are deposited onto the substrate. The number of processing steps involved in making thin film circuit modules should, however, preferably be maintained to a minimum, especially the number of firing cycles. Each additional or unnecessary firing cycle adversely affects the characteristics of a passive device, thereby decreasing the yield, for example, the ohmic resistance or temperature coefficient of a resistance element can change sufficiently with refiring to make the resistance element out of tolerance. The additional steps usually increase the cost of circuit modules. It would, therefore, also be desirable to deposit as many portions of a planar crossover on a substrate simultaneously with the depositing of the other passive devices. If the other passive devices are deposited by a screening and firing process, it would be desirable to fire the planar crossover through the same kiln at the same temperature.

Accordingly, it is an object of the present invention to provide an improved crossover having the various desirable features as set forth above.

An additional object of the present invention resides in a crossover lying in substantially a single plane.

Another object of the present invention is to provide a planar crossover which can be deposited onto a substrate with the same equipment employed in depositing other passive electrical devices.

A further object of the present invention resides in a method of depositing a planar crossover on a substrate by a screening and firing process identical to a process employed for depositing and firing other electrical devices.

Still another object of the present invention is to provide a crossover on a circuit module without increasing the thickness thereof.

Further objects and advantages of the present invention will become apparent as the following description proceeds, and the features of novelty characterizing the invention will be pointed out with particularlity in the claims annexed to and forming a part of this specification.

Briefly, the present invention is concerned with a planar crossover interconnecting a plurality of electrical devices supported on a surface of a substrate and comprises a first thin film conductor crossed by a second thin film conductor having a thin film insulating member of fused glass interposed between the first and second conductor electrically insulating the conductors from each other. In a preferred form of the invention, the thin film insulating member is deposited on the substrate by the same screening and firing process as employed in depositing other passive devices onto the substrate. Preferably when the insulating member is fired at the same temperature as the conductor, particles of a relatively inert or non-reactive filler material, for example, zircon, are mixed with and suspended in the glass forming the insulating member.

For a better understanding of the present invention, reference may be had to the accompanying drawings wherein.

Figure 1:
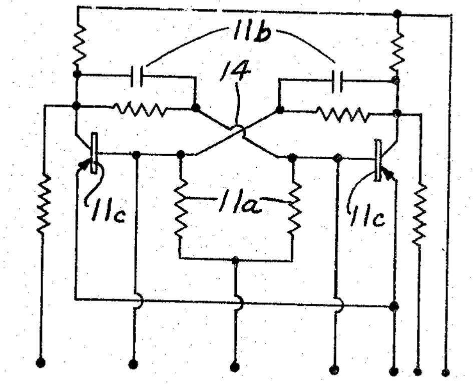
FIGURE 1 is a schematic view of a flip-flop circuit module requiring at least one crossover.
Figure 6:
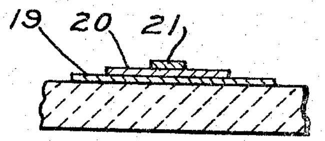
FIGURE 6 is a sectional view taken along lines VI—VI of FIGURE 2.
Figure 7:
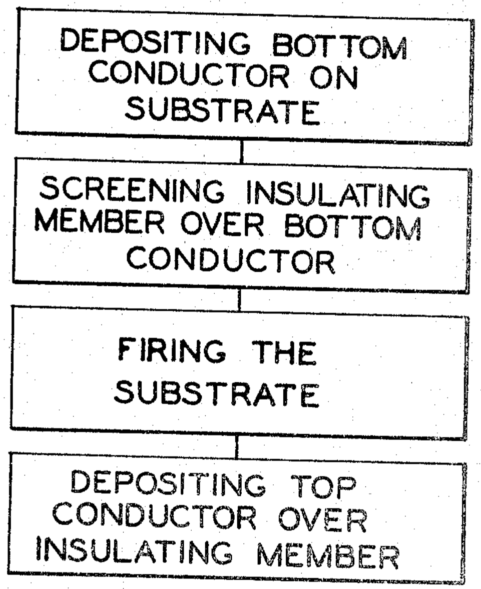
FIGURE 7 is a block diagram of the major steps involved in making a planar crossover in accord with the present invention.

Referring now particularly to the accompanying drawings, there is illustrated an electrical circuit, e.g., a thin film flip-flop circuit module, generally indicated at 10, comprising a plurality of electrical devices 11 such as resistance elements 11*a* and capacitors 11*b* supported on a substrate 12. All of the resistance elements 11*a* and capacitors 11*b* are of the thin film type deposited on the top surface 12*a* of the substrate while active devices 11*c*, such as transistors, are disposed when necessary on either side of the substrate. The substrate 12 may be a part of a complex panel adapted to have many electrical circuits applied thereonto or as illustrated in the drawings simply as a small rectangular substrate. Conductive paths 13 and a planar crossover 14 connect the thin film resistance elements 11*a* and thin film capacitors 11*b* together and to the active devices. As best shown in FIGURE 1 of the drawings the planar crossover 14 interconnects the left portion of the flip-flop circuit to the right portion.

Considering first the substrate 12, it is 1.1 x .75 inches having a thickness of approximately .030 inch. Larger or smaller substrates can be employed depending upon the application, for example, the substrate may be a circular disc .260 inch in diameter, and approximately .010 inch in thickness when mounted to a TO–5 can. When it is desirable to mount the circuit module 10 to a not-shown panel or the like, the substrate 12 is preferably provided with a plurality of apertures passing through conductive pads 15 at the outer edges of the substrate for receiving headed terminals 16. After all of the electrical devices 11 are secured to the substrate, the terminals 16 are inserted in the apertures 12*b* and fixedly secured to the substrate in a suitable manner as by staking or held in place with a fixture. The terminals 16 are then connected to the conductive pads with suitable metal deposits such as solder, the metal deposits also increasing the mechanical bond between the terminals and the substrate.

Figure 3:
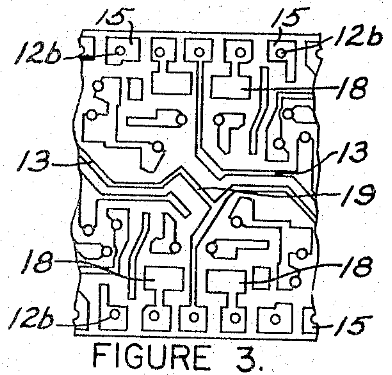
FIGURE 3 is a top plan view illustrating the result of the first step in the method of producing a planar crossover for a flip-flop circuit.

In accord with the present invention, a layer of conductive material is deposited on the top surface 12*a* of the substrate 12 by screening to form conductive pads 15, conductive paths 13, bottom electrodes 18 for capacitors and a bottom conductor 19 (see FIGURE 3) of the planar crossover 14. The layer of conductive material forming the conductive pads, the conductive paths, the electrodes for capacitors and the bottom conductor of the planar crossover preferably comprises nonoxidizable conductive metal particles such as silver, gold, and/or platinum mixed with glass particles. The conductive metal and glass particles are generally dispersed in a finely divided form in an organic vehicle or screening agent such as ethyl cellulose. The substrate with the screened-on layer of conductive material is then fired at a temperature above the melting point of the glass particles, but below that of the conductive metal paritcles, to drive off the organic vehicles and fuse the glass to bond the conductive metal, e.g., platinum-gold, particles together and to the substrate. The layer of conductive material is at least 50,000 angstroms thick. Two or more layers of conductive material are deposited on the substrate when necessary.

Figure 4:
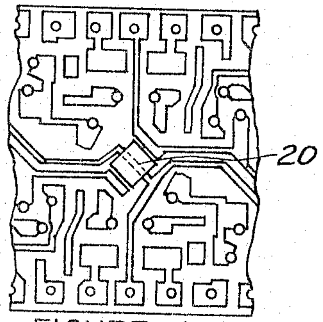
FIGURE 4 is a top plan view illustrating the result of the second step.
Figure 5:
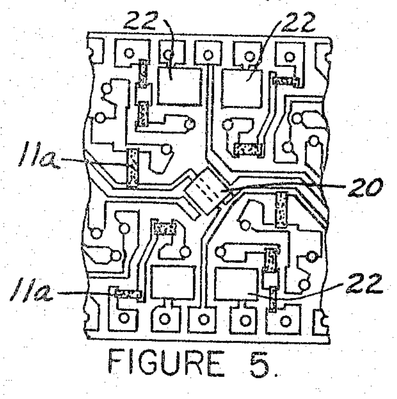
FIGURE 5 is a top plan view illustrating the result of depositing thin film resistance elements on the substrate.

After the layer of conductive material has been bonded or fused onto the surface of the substrate, a thin film insulating member 20 (see FIGURE 4) is deposited over the center portion of the bottom conductor 19. The insulating member 20 is preferably deposited, e.g., screened onto the top surface of the substrate 12 and fired with the same equipment and in the same manner as the layer of conductive material. The layer of conductive material can, however, be deposited on the substrate by vacuum deposition or the like and the insulating member 20 by screening. It is essential that the insulating member 20 have at least one characteristic different from that ordinarily required for a capacitor dielectric, i.e., the insulating member of the planar crossover should have a low dielectric constant to avoid parasitic coupling during operating conditions of the circuit module under various frequencies, temperatures, humidity and other conditions. The insulating member should also have high insulation resistance and high voltage breakdown.

The manufacturing steps or processes involved in depositing and fusing the insulating member to the substrate must also be compatible with the manufacturing steps of the other devices. For example, if different firing temperatures are employed, it is necessary that the firing temperature for bonding the insulating member to the substrate not be harmful or damaging to the layer of conductive material. Regardless of the firing temperature, the insulating member 20 should not attack the underlying portion of the conductor during manufacturing or operating conditions. It is also essential that the insulating member 20 have a temperature coefficient of expansion similar to the substrate and the bottom conductor to prevent crazing of the insulating member.

Figure 2:
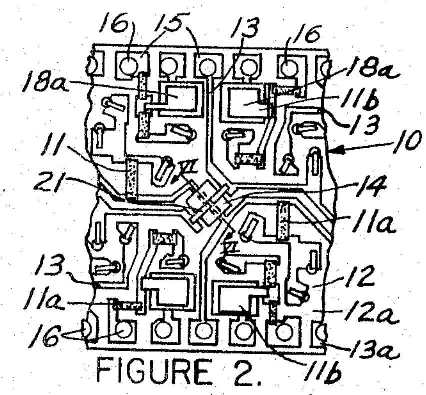
FIGURE 2 is a top plan view of a portion of a thin film flip-flop circuit module schematically shown in FIGURE 1 and having a planar crossover made in accord with the present invention.

In one preferred form of the invention, the insulating member 20 contains glass particles having the same softening point as the softening point of the glass particles bonding together the conductive metal particles in the bottom conductor. When the glass particles forming the insulating member are of the same composition or have the same or lower specific gravity as the glass particles in the bottom conductor, the glass particles in the insulating member will not mix with the bottom conductor when the substrate is fired. After the insulating member 20 is fused to the substrate 12, a top conductor 21 (see FIGURE 2) is deposited over the insulating member 20 at an angle to the bottom conductor and fired. The top conductor 21 contains the same conductive metal particles as the bottom conductor 19 to obtain high reliability. If the thickness of the insulating member is to be maintained at a minimum, it is essential that the glass particles bonding together the conductive metal particles of the top conductor 21 have a lower softening point than the softening point of the glass particles of the insulating member to prevent the conductive metal particles of the top conductor 21 from sinking into the insulating member 20 when the top conductor is fired and decreasing the breakdown voltage between the top and bottom conductors.

According to another preferred form of the invention, the softening point and composition of the glass particles in the bottom and top conductors and the insulating member is the same. To prevent the conductive particles from sinking into the insulating member, a filler, i.e, particles of an inert material, e.g., titania or zircon ($TiO_2$ or $ZrSiO_4$), having a substantially higher softening point than the glass particles, is admixed with the glass particles forming the insulating member. The filler supports and prevents the conductive particles of the top conductor from sinking into the insulating member. Moreover, some particles of the filler, e.g., titania or zircon, are dissolved in the fused glass forming the insulating member thereby increasing the softening point thereof. The conductive metal particles of the top conductor 21 will not, therefore, sink into the insulating member 20 even though the firing temperatures for bonding the top conductor 21 to the insulating member 20 and the insulating member to the substrate are the same. It is, therefore, essential that the insulating material comprise a filler if only one firing temperature is employed in processing the thin film electrical devices such as might be required for obtaining high reliability. After the insulating member has been fused onto the center portion of the bottom conductor, the dielectric layers 22 of the capacitors 11*b* are deposited over the bottom electrodes and fired in a suitable manner. The next processing step comprises depositing the top conductor over the insulating member at an angle to the bottom conductor, preferably normal thereto. The top electrodes 18*a* of the capacitors can be deposited and fired simultaneously with the top conductor 21 of the planar crossover if the composition of the electrodes and the conductors is the same. When certain capacitor characteristics are desired it is sometimes necessary to deposit and fire the dielectric layer 22 before the insulating layer. Other passive devices such as the thin film resistance elements 11*a* are deposited on the substrate and fired to fuse and bond the resistance elements to the substrate before or after the top conductor and top electrodes are fused to the substrate. The firing temperature of the resistance elements is preferably the same as the firing temperature of the planar crossover. For most efficient operation, the insulating member 20, the dielectric layer 22, and the resistance elements 11*a* are fired at the same time if the insulating member 20, the dielectric layer 22 and the resistance elements are screened and air dried in sequence.

For those skilled in this art, the foregoing explanation and description are no doubt sufficient to enable them to practice the invention without further information, but to insure against any possible misunderstanding, the following examples of specific formulae for the production of the planar crossover are offered:

EXAMPLE I

*Insulating member glass composition*

| | | |
|---|---|---|
| $SiO_2$ | percent | 80 |
| $B_2O_3$ | do | 14 |
| $Na_2O$ | do | 4 |
| $Al_2O_3$ | do | 2 |
| Softening point | °C | 1010 |

*Top conductor glass composition*

| | | |
|---|---|---|
| PbO | percent | 63 |
| $B_2O_3$ | do | 25 |
| $SiO_2$ | do | 12 |
| Softening point | °C | 800 |

The planar crossover of Example I employs the same glass composition for the insulating member and the bottom conductor, although a glass composition having a slightly higher softening point than the glass composition of the insulating member may be used for the bottom conductor. The glass composition employed for bonding the conductive metal particles together in the top conductor has a softening point lower than the glass composition forming the insulating member to prevent the conductive metal particles from sinking into the insulating member during the firing operation. Obviously, a glass composition having a higher softening point can be employed for the top conductor of Example I so long as the softening point is below 1000° C. If the glass composition employed in the top and bottom conductors and the insulating member is the same, then the thickness of the insulating member must be increased sufficiently to withstand the required voltage breakdown test.

EXAMPLE II

*Insulating member glass composition*

| | | |
|---|---|---|
| $SiO_2$ | percent | 65 |
| $B_2O_3$ | do | 26 |
| $Na_2O$ | do | 5.5 |
| $Al_2O_3$ | | 1 |
| Softening point | °C | 925 |

The top conductor glass composition of Example I can readily be deposited over the insulating member of Example II since it has a lower softening point. The conductive metal particles will not, therefore, sink into the insulating member.

In the following examples up to 70% of a filter is added to the insulating member glass composition.

EXAMPLE III

*Insulating member glass composition*

| | | |
|---|---|---|
| PbO | percent | 65 |
| $Al_2O_3$ | do | 1 |
| $SiO_2$ | do | 34 |
| Softening point | °C | 800 |

EXAMPLE IV

*Insulating member glass composition*

| | | |
|---|---|---|
| PbO | percent | 64 |
| $Al_2O_3$ | do | 4.5 |
| $SiO_2$ | do | 31.5 |
| Softening point | °C | 800 |

EXAMPLE V

*Insulating member glass composition*

| | | |
|---|---|---|
| PbO | percent | 70 |
| $Bi_2O_3$ | do | 10 |
| $SiO_2$ | do | 20 |
| Softening point | °C | 850 |

The fillers should essentially comprise an inert compound having a high softening point such as titania or zircon which have softening points of approximately 2100 and 1800° C. respectively. Moreover, it is preferable that if certain amounts of the filler particles dissolve in the glass the softening point will be increased. Thus any filler which partially or completely dissolves in the glass decreasing its softening point is not preferred. According to the above examples, laboratory tests have revealed that by admixing a filler with the glass to form an insulating layer the softening point is increased approximately 5–10%, i.e., in the range of 850° C. if the glass from Examples III and IV is employed. It is to be understood however, that the initial firing temperature of the insulating member glass composition it at the temperature specified, e.g., 800° C. for the glass composition of Example IV but upon refiring a higher temperature is required to soften the glass to the same consistency since some of the filler has dissolved therein. One or more of the following fillers is admixed with the glass compositions forming the insulating members of Examples III, IV and V.

| | |
|---|---|
| $ZrO_2$—$Ta_2O_5$ | $ZrO_2$—$Nb_2O_5$ |
| $Nb_2O_5$—$Ta_2O_5$ | $Nb_2O_5$—$SiO_2$ |
| $ZrO_2$—$TiO_2$ | $TiO_2$—$Nb_2O_5$ |
| $HfO_2$—$ZrO_2$ | $HfO_2$—$Nb_2O_5$ |
| $ZrO_2$—$SiO_2$ | |

The above fillers or mixtures thereof or double oxide compounds can readily be employed as well as other fillers having the same characteristics. In addition, the temperature coefficient of expansion of the glass particles in the insulating member and the bottom and top conductors should be similar to the temperature coefficient of expansion of the substrate. For example, a fused quartz substrate is preferred for the glass composition of Example I, alumina substrates for the glass compositions of Examples II, III and IV and a steatite substrate for the glass composition of Example V.

When the planar crossover is deposited on the substrate by screening and firing, a significant advantage of the present invention resides in the fact that all of the materials used in the production of the circuit module can be screened and fired on the surface of the substrate. Such advantage makes handling and processing of the circuit module a rather simple and facile manufacturing procedure. Depending on the composition of the mixtures employed in preparing the various components deposited on the substrate, they can be fired in a conventional oven capable of producing temperature of approximately 800° C. to 1050° C., i.e., high enough to melt the glass particles but not the conductive metal particles employed in the layers of conductive material as well as the particles of filler employed in the insulating member.

The planar crossover deposited by screening is also compatible with many other systems, in other words, the layers of conductive material forming the electrodes, conductive pads, conductive paths and top and bottom electrodes can be deposited on the substrate by vapor deposition, brushing or the like. The conductive metal and glass particles employed in the present invention preferably have a particle size passable through a 325 mesh screen and the size of the particles of filler should preferably be in the range of 10 to 100 microns.

While there has been illustrated and described what are at present considered to be specific examples and specific embodiments of the present invention, it will be appreciated that numerous changes and modifications are likely to occur to those skilled in the art, and it is intended in the appended claims to cover all those changes and modifications which fall within the true spirit and scope of the present invention.

What is claimed as new and desired to be secured by Letters Patent of the United States is:

1. A planar circuit component comprising a high-temperature-resistant electrically nonconductive substrate having a top surface, a first thin film conductor disposed on the surface of the substrate, a thin film insulating member overlying the center portion of the first thin film conductor, and a second thin film conductor disposed on the surface of the substrate and overlying a portion of the thin film insulating member, the second thin film conductor containing a glass having a softening temperature lower than the softening temperature of the insulating member, the major axis of the first thin film conductor being at an angle to the major axis of the second thin film conductor, the thin film insulating member comprising inert filler particles selected from the group consisting of $ZrO_2$, $Ta_2O_5$, $Nb_2O_5$, $TiO_2$, $HfO_2$ and $SiO_2$ and any mixtures and any double oxide compounds thereof, and a glass bonding together the particles, said particles having a softening temperature substantially higher than the glass bonding the particles together, only a portion of the filler particles being dissolved in the glass of the insulating member.

2. In a circuit module of planar construction containing a plurality of electrical devices supported on a high-temperature-resistant dielectric substrate, the improvement comprising a planar lead crossover bonded to a surface of the substrate electrically connecting the devices, said crossover comprising a first and second thin film conductors containing particles of a nonoxidizable metal selected from the group consisting of Au, Ag, and Pt bonded to the substrate, the second thin film conductor being disposed at an angle to the first thin film conductor with the center portion of the second thin film conductor overlying the center portion of the first thin film conductor, and a thin film insulating member comprising glass particles and filler particles selected from the group consisting of $ZrO_2$, $Ta_2O_5$, $Nb_2O_5$, $TiO_2$, $HfO_2$ and $SiO_2$ and any mixtures and any double oxide compounds thereof interposed between the center portions of the first thin film conductor and the second thin film conductor electrically insulating the conductors from each other only a portion of the filler particles being dissolved in the glass of the insulating member.

3. The circuit module of claim 2, wherein the thickness of the thin film insulating member is between .0005 to .010 inch.

4. The planar lead crossover of claim 2, wherein the filler particles are of a size in the range of 10 to 100 microns.

5. In a circuit module having a plurality of electrical devices supported on a high-temperature-resistant dielectric substrate, the improvement comprising a planar lead crossover bonded to a surface of the substrate for electrically connecting the devices, said crossover comprising a first and second thin film conductors containing a nonoxidizable metal selected from the group consisting of Au, Ag, and Pt bonded to the substrate, the second thin film conductor being disposed at an angle to the first thin film conductor with the center portion of the first thin film conductor overlying the center portion of the second thin film conductor, and a thin film insulating member containing 30 to 99% glass particles and 1 to 70% filler particles having a softening temperature substantially higher than the glass particles interposed between the center portions of the first thin film conductor and the second thin film conductor electrically insulating the conductors from each other, only a portion of the filler particles being dissolved in the glass of the insulating member.

6. A method of making a planar crossover on a ceramic dielectric substrate comprising the steps of:

(a) depositing a bottom conductor containing conductive metal and glass particles on a surface of the substrate, (b) firing the substrate at a temperature sufficient to soften the glass particles and fuse the bottom conductor to the surface of the substrate, (c) cooling the substrate, (d) depositing an insulating member over the center portion of the bottom conductor, the insulating member comprising inert electrically nonconductive filler particles mixed with glass particles having a softening temperature the same as the glass particles in the bottom conductor, (e) firing the substrate at the above temperature to soften the glass particles of the insulating member and fuse the insulating member to the substrate and maintaining the firing temperature for a sufficient time to dissolve some of the filler particles in the glass to increase the softening temperature of the insulating member, (f) cooling the substrate, (g) depositing a top conductor over the insulating member at an angle to the bottom conductor, the top conductor containing the same composition as the bottom conductor, (h) firing the substrate at the above temperature to soften the glass particles and fuse the top conductor to the insulating member and the substrate, and (i) cooling the substrate.

7. A method of making a thin film circuit module on a ceramic dielectric substrate comprising the steps of:

(a) depositing simultaneously a bottom conductor for a planar crossover and conductive paths for resistance elements containing conductive metal and glass particles on a surface of the substrate, (b) firing the substrate at a temperature sufficient to soften the glass particles and fuse the bottom conductor and the conductive paths to the surface of the substrate, (c) cooling the substrate, (d) depositing an insulating member over the center portion of the bottom conductor, the insulating member comprising inert electrically nonconductive filler particles mixed with glass particles having a softening temperature the same as the glass particles in the bottom conductor, (e) firing the substrate at the above temperature to soften the glass particles of the insulating member and fuse the insulating member to the substrate and maintaining the firing temperature for a sufficient time to dissolve some of the filler particles in the glass to increase the softening temperature of the insulating member, (f) cooling the substrate, (g) depositing a top conductor over the insulating member at an angle to the bottom conductor, the top conductor containing the same composition as the bottom conductor, (h) depositing resistance elements comprising glass and noble metal particles on the substrate in overlapping relationship with the conductive paths, (i) firing the substrate at the above temperature to soften the glass particles and fuse the top conductor and the resistance elements to the substrate, and (j) cooling the substrate.

References Cited by the Examiner

UNITED STATES PATENTS

| | | | |
|---|---|---|---|
| 2,398,176 | 4/1946 | Deyrup | 317—261 X |
| 2,711,983 | 6/1955 | Hoyt. | |
| 2,721,822 | 10/1955 | Pritikin. | |
| 2,749,382 | 6/1956 | Lockhard | 174—117 X |
| 2,759,854 | 8/1956 | Kilby | 317—101 X |
| 3,042,741 | 7/1962 | Cumpston | 174—68.5 |
| 3,085,899 | 4/1963 | Forman | 117—70 X |

FOREIGN PATENTS

| | | |
|---|---|---|
| 1,345,163 | 10/1963 | France. |

LEWIS H. MYERS, *Primary Examiner.*

D. L. CLAY, *Assistant Examiner.*